(12) United States Patent
Shinoda et al.

(10) Patent No.: US 8,034,667 B2
(45) Date of Patent: Oct. 11, 2011

(54) SEMICONDUCTOR SEALING RESIN SHEET AND SEMICONDUCTOR DEVICE MANUFACTURING METHOD USING THE SAME

(75) Inventors: Tomonori Shinoda, Saitama (JP); Osamu Yamazaki, Saitama (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 11/597,299

(22) PCT Filed: May 26, 2005

(86) PCT No.: PCT/JP2005/009697
§ 371 (c)(1),
(2), (4) Date: Nov. 22, 2006

(87) PCT Pub. No.: WO2005/117093
PCT Pub. Date: Dec. 8, 2005

(65) Prior Publication Data
US 2007/0254410 A1  Nov. 1, 2007

(30) Foreign Application Priority Data
May 27, 2004  (JP) ................. 2004-158024

(51) Int. Cl.
*H01L 21/00*  (2006.01)
(52) U.S. Cl. .......... 438/127; 257/787; 257/678
(58) Field of Classification Search .......... 257/787, 257/788, 790, 777, 778, 700; 264/272.11; 439/55
See application file for complete search history.

(56) References Cited

U.S. PATENT DOCUMENTS 5,126,188 A    6/1992  Shimizu et al.
5,381,039 A *  1/1995  Morrison .......... 257/701
(Continued)

FOREIGN PATENT DOCUMENTS
EP    1088870 A1    4/2001
(Continued)

OTHER PUBLICATIONS

Brostow, Witold et al., "Cure progress in epoxy systems: dependence on temperature and time", Materials Research Innovations, vol. 7, No. 3, Jun. 2003, pp. 125-132.

(Continued)

*Primary Examiner* — Marcos D. Pizarro
*Assistant Examiner* — Eva Yan Montalvo
(74) *Attorney, Agent, or Firm* — The Webb Law Firm

(57) ABSTRACT

A semiconductor sealing resin sheet is composed of a supporting sheet and a sealing resin layer releasably laminated on the supporting sheet, wherein the sealing resin layer has a thermosetting property, the elastic modulus of the sealing resin layer before thermosetting is $1.0 \times 10^3$ to $1.0 \times 10^4$ Pa, the melt viscosity 120° C. of the sealing resin layer before thermosetting is 100 to 200 Pa·s, and the time required for the melt viscosity to reach its minimum value is 60 sec or less when the sealing resin layer before thermosetting is kept at a constant temperature of 120° C. A method for manufacturing semiconductor devices includes the steps of preparing a circuit substrate with a semiconductor chip mounted thereon, the circuit substrate is heated, the surface of the sealing resin layer in the semiconductor sealing resin sheet described above is embedded in concavo-convex parts and gaps on the semiconductor-chip-mounted surface of the circuit substrate, and the surface of the sealing resin layer is brought into contact with the surface of the circuit substrate and then the sealing resin layer is thermally cured.

3 Claims, 3 Drawing Sheets

U.S. PATENT DOCUMENTS

| | | | |
|---|---|---|---|
| 6,277,481 B1* | 8/2001 | Sugino et al. | 428/317.1 |
| 6,590,070 B1 | 7/2003 | Toriumi et al. | |
| 6,620,862 B2 | 9/2003 | Ueda et al. | |
| 6,919,262 B2 | 7/2005 | Senoo et al. | |
| 2001/0009342 A1 | 7/2001 | Furukawa et al. | |
| 2003/0183947 A1* | 10/2003 | Ohuchi | 257/778 |
| 2005/0029906 A1* | 2/2005 | Miyaji | 310/348 |
| 2008/0241995 A1 | 10/2008 | Fukui et al. | |

FOREIGN PATENT DOCUMENTS

| | | |
|---|---|---|
| EP | 1244143 A2 | 9/2002 |
| EP | 1763070 A1 | 3/2007 |
| JP | 3208221 A | 9/1991 |
| JP | 9-008179 A | 1/1997 |
| JP | 11-251347 A | 9/1999 |
| JP | 2001-332520 A | 11/2001 |
| JP | 2003-298389 * | 10/2003 |
| JP | 2004123796 A | 4/2004 |
| WO | 2004037939 A1 | 5/2004 |

OTHER PUBLICATIONS

Tajima, Yuji A. et al., "Chemorheology of an Amine-Cured Epoxy Resin", Polymer Engineering and Science, vol. 26, No. 6, Mar. 1986, pp. 427-431.

* cited by examiner

SEMICONDUCTOR SEALING RESIN SHEET AND SEMICONDUCTOR DEVICE MANUFACTURING METHOD USING THE SAME

TECHNICAL FIELD

The present invention relates to a semiconductor sealing resin sheet and a method for manufacturing resin-sealed semiconductor devices using the same.

BACKGROUND ART

Many semiconductor devices are used in a packaged form in which a semiconductor element mounted on a circuit substrate is sealed with resin.

As a method for packaging a semiconductor element, there has generally been used a method in which a lead-frame (a sheet metal, a TAB tape or the like) with a device mounted thereon is fixed in a mold, and a melted resin is injected to the mold and solidified therein to seal. However, this method has a limitation in manufacturing a thin-walled package. This is because a mold with high precision in the thickness is difficult to make, and even though such a mold can be produced, the fine structures (circuits, wires and the like) of a device may be damaged by flow pressure of the resin that is injected into a narrow space. Further, with resin sealing using a mold, small-lot production and mass-production require molds with comparable quality, so that the production cost of the mold is concerned about in small-lot production.

For these reasons, there has been proposed a method for sealing a semiconductor element with a resin sheet in place of a mold.

For example, Patent Document 1 discloses "a method for manufacturing a semiconductor package in which a semiconductor element mounted on a circuit substrate having a wiring pattern and the connecting part of the wiring pattern and the semiconductor element are sealed with resin, wherein a resin is applied in an amount in accordance with the size of the semiconductor element on the surface of a base tape to form a pattern in accordance with the shape of the semiconductor element; the resin is melted in accordance with the mechanical strength of the semiconductor element and the connecting part; the semiconductor element and the melted resin are aligned by adjusting the positions of the circuit substrate and the base tape; a given pressure is applied to the aligned resin and the semiconductor element to embed the semiconductor element into the melted resin, thereby sealing the semiconductor element and the connecting part without being damaged". Patent Document 1 described an uncured thermosetting epoxy resin as the resin used for sealing.

However, the following problems have been found in sealing with such an uncured epoxy resin as described above.

(1) In a mounting method as referred to a flip-chip mounting method, a chip and a circuit substrate are connected through solder balls formed on the undersurface of the chip. In this mounting method, the side surface of the chip is at almost right angle with the circuit substrate plane, that is, the chip is protruded almost perpendicularly out of the circuit substrate plane. Even though a semiconductor element is embedded in melted resin by the method of Patent Document 1 above, the rectangular part (around the legs of the chip) is not fully filled with the resin and voids are formed. To fill the resin sufficiently, the semiconductor element may be embedded in the resin at high pressure. However, high pressure is difficult to apply to the melted resin in a fluid state, and the semiconductor element may be damaged if pressure is excessively applied.

(2) In a mounting method as referred to a wire-bonding mounting method, an IC chip and a circuit substrate are connected with extremely thin gold wires. The gold wires may be deformed or broken even by slight external force. In the aforementioned method of Patent Document 1, it is described that a semiconductor element is embedded in a melted resin, sealing the semiconductor element and the connecting part without being damaged. However, with the uncured epoxy resin specifically disclosed in Patent Document 1, if used alone, the melt properties thereof are difficult to control to be within a proper range. For example, when the fluidity of the melted resin becomes too high, the resin also diffuses into other parts beyond parts where necessary, causing fouling or defective appearance of the device. On the other hand, when the fluidity of the melted resin is too low, the gold wire may be deformed or broken before embedded in the resin.

Patent Document 1: Japanese Patent Laid-Open Publication No. 251347/1999.

SUMMARY OF THE INVENTION

The present invention, which has been made in view of the conventional art as mentioned above, has as an objective to provide a semiconductor sealing resin sheet with which no void is formed in sealing a flip-chip bonded device and neither deformation nor breakage is caused to wires in sealing a wire-bonded device, and a method for manufacturing semiconductor devices using the resin sheet.

The main aspects of the present invention to solve these problems are as follows:

[1] A semiconductor sealing resin sheet composed of a supporting sheet and a sealing resin layer releasably laminated on the supporting sheet, wherein the sealing resin layer has a thermosetting property, the sealing resin layer before thermosetting has an elastic modulus of $1.0 \times 10^3$ to $1.0 \times 10^4$ Pa and a melt viscosity at 120° C. of 100 to 200 Pa·s, and the time required for the melt viscosity to reach its minimum value is 60 sec or less when the sealing resin layer before thermosetting is kept at a constant temperature of 120° C.;

[2] The semiconductor sealing resin sheet described in [1], used for sealing a flip-chip bonded device or a wire-bonded device;

[3] A method for manufacturing semiconductor devices comprising a step in which a circuit substrate with a semiconductor chip mounted thereon is prepared; the circuit substrate is heated; the surface of the sealing resin layer in the semiconductor sealing resin sheet described in [1] is embedded in concavo-convex parts and gaps on the semiconductor-chip-mounted surface of the circuit substrate and after the surface of the sealing resin layer is brought into contact with the surface of the circuit substrate and then the sealing resin layer is thermally cured; and

[4] The method for manufacturing semiconductor devices described in [3], wherein the semiconductor chip is mounted on the circuit substrate in a flip-chip bonded form or in a wire-bonded form.

The present invention provides a semiconductor sealing resin sheet with which no void is formed in sealing a flip-chip bonded device and neither deformation nor disconnection is caused to wires in sealing a wire-bonded device, and a method for manufacturing semiconductor devices using the resin sheet. The present invention can contribute to improving the quality and productivity of semiconductor devices.

BEST MODE FOR CARRYING OUT THE INVENTION

The present invention will be specifically explained below with reference to drawings.

Figure 1:
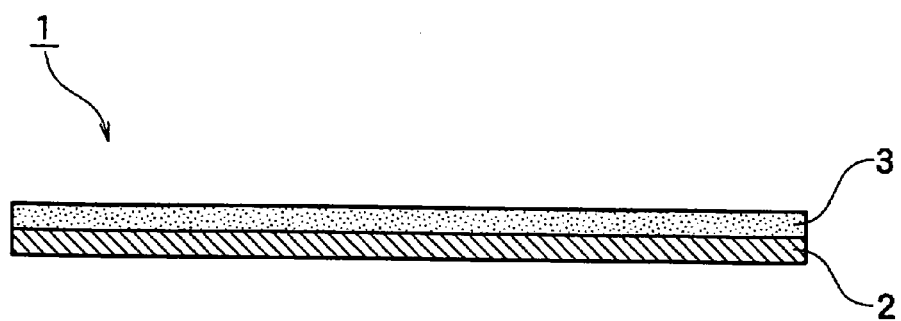
FIG. 1 shows a semiconductor sealing resin sheet relating to the present invention.

As shown in FIG. 1, a semiconductor sealing resin sheet 1 relating to the present invention is composed of a supporting sheet 2 and a sealing resin layer 3 releasably laminated on the supporting sheet 2.

The supporting sheet 2 and the sealing resin layer 3 will be explained respectively below.

"Supporting Sheet 2"

Films used as the supporting sheet 2 in the resin sheet 1 include, for example, a polyethylene film, a polypropylene film, a polybutene film, a polybutadiene film, a polymethylpentene film, a polyvinyl chloride film, a vinyl chloride copolymer film, a polyethylene terephthalate film, a polyethylene naphthalate film, a polybutylene terephthalate film, a polyurethane film, an ethylene-vinyl acetate film, an ionomer resin film, an ethylene/(meth) acrylic acid copolymer film, an ethylene/(meth)acrylate ester copolymer film, a polystyrene film, a polycarbonate film, a polyimide film, a fluoro resin film and the like. A film cross-linked thereof may also be used. Further, a laminated film thereof may be used. Furthermore, these films each may be a transparent film, a colored film or an opaque film.

In the method for manufacturing semiconductor devices relating to the present invention, as described later, the supporting sheet 2 and the sealing resin layer 3 are releasably laminated so that the sealing resin layer 3 in supporting sheet 2 can be transferred to the chip-mounted surface of a circuit substrate. For this purpose, it is desirable that the surface tension of the surface, of supporting sheet 2, that contacts with the sealing resin layer 3 be preferably 40 mN/m or lower, more preferably 37 mN/m or lower, particularly preferably 35 mN/m or lower. Such a film having a low surface tension can be obtained by selecting a material as appropriate, or by performing release treatment in which the film surface is coated with a release agent such as silicone resin or alkyd resin.

The thickness of the supporting sheet 2 is generally from 10 to 500 μm, preferably from 15 to 300 μm, particularly preferably from 20 to 250 μm.

"Sealing Resin Layer 3"

The sealing resin layer 3 has a thermosetting property and specific rheological properties upon heating environment.

The resin sheet 1 of the present invention is preferably used in a process in which the sealing resin layer 3 is transferred to the chip-mounted surface of a circuit substrate and the chip and the circuit are sealed by curing the resin layer to obtain a resin-sealed semiconductor device. In particular, in the method for manufacturing semiconductor devices relating to the present invention, which is described later, a chip-mounted circuit substrate is heated; the sealing resin layer 3 in the resin sheet 1 is embedded in concavo-convex parts and gaps on the chip-mounted surface; the surface of the sealing resin is brought into contact with the surface of the circuit substrate; and eventually, the sealing resin layer 3 is cured. The surface of the circuit substrate is heated at a temperature slightly higher than the melting temperature of the sealing resin layer 3 and is lower than the curing temperature thereof, so that the resin exhibits an appropriate fluidity. At this time, if the sealing resin layer 3 is softened too much, the resin may become excessively fluidized and diffuse into other parts beyond parts where necessary, causing fouling or defective appearance of the device.

Therefore, in the present invention, the sealing resin layer 3 before thermosetting has an elastic modulus of $1.0 \times 10^3$ to $1.0 \times 10^4$ Pa, preferably $1.0 \times 10^3$ to $5.0 \times 10^3$ Pa. The elastic modulus of the sealing resin layer 3 is measured at 100° C. with a dynamic viscoelasticity measuring apparatus at a frequency of 1 Hz. When the elastic modulus of the sealing resin layer 3 before thermosetting is in the above range, the sealing resin layer 3 is unlikely to be deformed during storage or transportation, and the accuracy in the thickness of the sealing resin layer 3 is maintained.

Further, if the sealing resin layer 3 is too hard in pressing to attach to the chip-mounted surface, the resin may likely not be fully filled and voids are formed in a flip-chip bonded device, or wires may likely be deformed or broken in a wire-bonded device. On the other hand, if the sealing resin layer 3 is too soft, the sealing resin is excessively fluidized and may diffuse into other parts beyond parts where necessary, causing fouling or defective appearance of the device. Therefore, the sealing resin layer 3 at pressing to attach to the chip-mounted surface, that is, the sealing resin layer 3 before thermosetting, is required to have moderate melt properties.

To meet this requirement, the melt viscosity at 120° C. of the sealing resin layer 3 before thermosetting is 100 to 200 Pa·s, preferably is 110 to 190 Pa·s. The melt viscosity at 120° C. of the sealing resin layer 3 before thermosetting is measured with a dynamic viscoelasticity measuring apparatus at a frequency of 1 Hz.

In addition, when the sealing resin layer before thermosetting is kept at a constant temperature of 120° C., the time required for the melt viscosity to reach its minimum value is 60 sec or less, preferably 50 sec or less, more preferably 40 sec or less. A sealing resin containing a polymer in the composition thereof takes time before the whole resin shows a uniform viscosity even when the temperature becomes high. Therefore, when the temperature is kept constant after it is elevated, the viscosity of the sealing resin gradually decreases. The sealing resin, however, has a thermosetting property, so that the viscosity increases with time due to thermosetting. Here, the time required for the melt viscosity at 120° C. of the sealing resin layer 3 to reach its minimum value is measured with a dynamic viscoelasticity measuring apparatus at a frequency of 1 Hz.

When the surface of the resin layer comes into contact with the chip-mounted surface of the heated circuit substrate, the sealing resin layer 3 is locally heated and the viscosity locally decreases. After that, the chip-mounted surface is resin-sealed. As examples, cases for a flip-chip bonded device and a wire-bonded device are explained below.

Resin sealing of a flip-chip bonded device is first explained. When a resin sheet is perpendicularly pressed to attach to a chip mounted on a heated circuit substrate, the viscosity of the sealing resin layer decreases locally only in the part adjacent to the chip, and it becomes that the chip is embedded in sealing resin layer 3. In addition, the resin that is extruded out of the upper surface of the chip is flowed by pressing and effect of heat from the side surface of the chip, and also fills the space around the legs of the chip, thereby avoiding formation of voids. On the other hand, since heat conduction to the resin away from the chip is delayed and hence the viscosity does not substantially decrease before the sealing resin layer 3 comes into contact with the circuit substrate body, the sealing resin layer 3 is not deformed. When the sealing resin layer is pressed to attach to the circuit substrate, amount of the resin running off from the periphery of the circuit substrate is small, whereby the accuracy in the thickness is maintained. In this way, concavo-convex parts and gaps of the circuit substrate are fully filled with the sealing resin, and the quality of the semiconductor device is improved.

Next, resin sealing a wire-boded device is explained. When a resin sheet is perpendicularly pressed to a chip mounted on a heated circuit substrate, the sealing resin layer 3 comes into contact with wires at first, and the viscosity of the sealing resin layer 3 decreases locally only in the part adjacent to the wires. The wires are immediately embedded in the sealing resin layer 3, so that the wires are less damaged. On the other hand, heat conduction to the resin far away from the heated wires, chip or circuit substrate body is delayed, and hence the viscosity does not substantially decrease before sufficient time is passed after the sealing resin comes into contact with the chip and the circuit substrate body.

Further, as the above-mentioned case of a flip-chip bonded device, the resin adjacent to or contact with the chip or the circuit substrate is fluidized prior to the resin layer distant therefrom, whereby the sealing resin fully flows over the top surface, side surfaces, legs of the chip and the circuit substrate body. In this way, concavo-convex parts and gaps of the circuit substrate are fully filled with the sealing resin without causing any damage to the wires, thereby improving the quality of the semiconductor device.

The sealing resin layer 3 basically contains a binder component (A) and a thermosetting component (B) as essential components, and is optionally mixed with another additive (C).

The components (A), (B), and (C) are explained below.

"Binder Component (A)"

As the component (A), any polymer with an adhesive property may be used without any limitation, but typically an acrylic polymer is preferably used. As the repeating unit of the acrylic polymer, there may be mentioned a repeating unit derived from a (meth)acrylate monomer or a (meth) acrylic acid derivative. The (meth)acrylate monomer used here is a cycloalkyl(meth)acrylate, benzyl(meth)acrylate, or an alkyl (meth)acrylate having an alkyl group with 1 to 18 carbon atoms. Among them, an alkyl(meth)acrylate having an alkyl group with 1 to 18 carbon atoms is particularly preferable, which includes, for example, methyl acrylate, methyl methacrylate, ethyl acrylate, ethyl methacrylate, propyl acrylate, propyl methacrylate, butyl acrylate, butyl methacrylate and the like. The (meth)acrylic acid derivative includes, for example, glycidyl(meth)acrylate and the like.

In particular, the acrylic polymer preferably contains a glycidyl(meth)acrylate unit and at least one kind of an alkyl (meth)acrylate unit. In this case, the content of the unit derived from glycidyl(meth) acrylic acid in the copolymer is typically 0 to 80% by mass, preferably 5% by mass to 50% by mass. By introducing a glycidyl group, the acrylic polymer attains improved compatibility with an epoxy resin, which is a thermosetting component described later, and improved heat resistance exhibiting higher Tg after curing. As the alkyl (meth)acrylate, it is preferred to use methyl(meth)acrylate, ethyl(meth)acrylate, butyl(meth)acrylate or the like. Further, when a hydroxyl group-containing monomer such as hydroxyethyl acrylate is introduced, it becomes easy to control the adhesiveness to an adherent and the adhesive properties.

The weight average molecular weight of the acrylic polymer is preferably 100000 or more, more preferably 150000 to 1000000.

"Thermosetting Component (B)"

The thermosetting component (B) has such a property of forming a three-dimensional network structure to firmly adhere to an adherend upon heating. Such a thermosetting component (B) is typically composed of a thermosetting resin such as epoxy, phenol, resorcinol, urea, melamine, furan, unsaturated polyester and silicone; and an appropriate curing promoter. Various kinds of such thermosetting components have been known. In the present invention, various thermosetting components publicly known so far may be used without any particular limitations. As an example of the thermosetting component, there may be mentioned an adhesive component composed of an epoxy resin (B-1) and a heat activated latent curing agent for epoxy-resin (B-2).

As the epoxy resin (B-1), various epoxy resins publicly known so far may be used. Typically an epoxy resin having a weight average molecular weight of 300 to 2000 is preferable, and it is particularly preferred to use a normally liquid epoxy resin having a weight average molecular weight of 300 to 500, preferably 330 to 400, and a normally solid epoxy resin having a weight average molecular weight of 400 to 2000, preferably 500 to 1500, as a blend. An epoxy resin preferably used in the present invention has an epoxy equivalent weight of generally 50 to 5000 g/eq. As such an epoxy resin, there may be specifically mentioned a glycidyl ether of phenols such as bisphenol A, bisphenol F, resorcinol, phenol novolak, and cresol novolak; a glycidyl ether of alcohols such as butanediol, polyethylene glycol and polypropylene glycol; a glycidyl ether of a carboxylic acid such as phthalic acid, isophthalic acid and tetrahydrophthalic acid; a glycidyl- or alkylglycidyl-type epoxy resin given by substituting the active hydrogen bonded to the nitrogen atom in aniline, isocyanurate or the like with a glycidyl group; and a so-called alicyclic epoxide such as vinylcyclohexene diepoxide, 3,4-epoxycyclohexylmethyl-3,4-dicyclohexanecarboxylate, and 2-(3,4-epoxy)cyclohexyl-5, and 5-spiro(3,4-epoxy)cyclohexane-m-dioxane, in which an epoxy group is introduced by, for example, oxidizing a carbon-carbon double bond in the molecule. A dicyclopentadiene skeleton-containing epoxy resin, which has a dicyclopentadiene skeleton and a reactive epoxy group in the molecule, may also be used.

Among these, a bisphenol glycidyl-type epoxy resin, an o-cresol novolak-type epoxy resin and a phenol novolak-type epoxy resin are preferably used in the present invention.

These epoxy resins each may be used alone, or two or more kinds thereof may be used in combination.

The heat activated latent curing agent for epoxy resin (B-2) is a curing agent that does not react with an epoxy resin at room temperature but is activated by heating above a certain temperature to react with the epoxy resin.

As the method for activating the heat activated latent curing agent for epoxy resin (B-2), there may be mentioned a method in which active species such as cations and anions are generated through chemical reaction induced by heat; a method in which the curing agent is stably dispersed in an epoxy resin (B-1) around room temperature and becomes compatible with or soluble to the epoxy resin (B-1) at high temperatures to start curing reaction; a method in which a curing agent incorporated in molecular sieves is leached at high temperatures to start curing reaction; a method using microcapsules; and the like.

These heat activated latent curing agents for epoxy-resin each may be used alone, or two or more kinds thereof may be used in combination. In particular, among the above curing agents, dicyanediamide, an imidazole compound, and mixtures thereof are preferable.

The above heat-activated latent curing agent for epoxy resin (B-2) is used in an amount of generally 0.1 to 20 parts by mass, preferably 0.5 to 15 parts by mass, particularly preferably 1 to 10 parts by mass, with respect to 100 parts by mass of the epoxy resin (B-1).

"Other Components (C)"

A coupling agent (C1) may be admixed in the sealing resin layer 3. It is desirable that the coupling agent (C1) has a group that reacts with a functional group in the component (A) or the component (B), preferably the component (B).

In the curing reaction, the organic functional group contained in the coupling agent (C1) is considered to react with the thermosetting component (B) (particularly preferably, epoxy resin), whereby the adhesiveness and sealability are improved without impairing the heat resistance of the cured product, and further water resistance (resistance to moist heat) is also improved.

As the coupling agent (C1), a silane (silane coupling agent) is preferable in view of versatility and cost merit thereof. The coupling agent (C1) is used in an amount of typically 0.1 to 20 parts by mass, preferably 0.3 to 15 parts by mass, particularly preferably 0.5 to 10 parts by mass, with respect to 100 parts by mass of the thermosetting component (B).

A cross-linking agent (C2) such as an organic polyisocyanate compound and an organic polyimine compound may be also admixed in the sealing resin layer 3 to adjust the initial adhesiveness and cohesiveness before curing.

As the organic polyisocyanate compound, there may be mentioned an aromatic polyisocyanate compound, an aliphatic polyisocyanate compound, an alicyclic polyisocyanate compound, a trimer of these polyisocyanate compounds, an isocyanate-capped urethane prepolymer, which is obtained by reacting one of these polyisocyanate compounds and a polyol compound, and the like. More specific examples of the organic polyisocyanate compound include 2,4-tolylene diisocyanate, 2,6-tolylene diisocyanate, 1,3-xylylene diisocyanate, 1,4-xylene diisocyanate, diphenylmethane-4,4'-diisocyanate, diphenylmethane-2,4'-diisocyanate, 3-methyldiphenylmethane diisocyanate, hexamethylene diisocyanate, isophorone diisocyanate, dicyclohexylmethane-4,4'-diisocyanate, dicyclohexylmethane-2,4'-diisocyanate, lysine diisocyanate and the like.

Specific examples of the organic polyimine compound include N,N'-diphenylmethane-4,4'-bis(1-aziridinecarboxamide), trimethylolpropane-tri-β-aziridinylpropionate, tetramethylolmethane-tri-β-aziridinylpropionate, N,N'-toluene-2,4-bis (1-aziridinecarboxamide), triethylene melamine and the like. The cross-linking agent (C2) as described above is admixed in an amount of typically 0.1 to 20 parts by mass, preferably 0.2 to 10 parts by mass, with respect to 100 parts by mass of the binder component (A).

Further, filler such as asbestos, silica, glass, mica, chromium oxide, titanium oxide and pigment may be admixed in the sealing resin layer 3. These fillers may be admixed in an amount of 0 to 400 parts by mass with respect to 100 parts by mass of the total amount of the components (except filler) composing the sealing resin layer 3.

A thermoplastic resin having a glass transition point at a temperature of 60 to 150° C. may also be admixed in the sealing resin layer 3 to control heat responses (melt properties) thereof. As the thermoplastic resin, there may be mentioned, for example, polyester resin, polyvinyl alcohol resin, polyvinyl butyral, polyvinyl chloride, polystyrene, polyamide resin, cellulose, polyethylene, polyisobutylene, polyvinyl ether, polyimide resin, phenoxy resin, polymethyl methacrylate, styrene-isoprene-styrene block copolymer, styrene-butadiene-styrene block copolymer and the like. Among them, phenoxy resin is particularly preferable, since it has an excellent compatibility with the other components of the sealing resin layer.

The amount of the thermoplastic resin admixed in the sealing resin layer 3 is preferably 1 to 50 parts by mass, more preferably 2 to 40 parts by mass, particularly preferably 3 to 30 parts by mass, with respect to 100 parts by mass of the total amount of the binder component (A) and the thermosetting component (B). When an acrylic polymer is used as the binder component (A), the weight ratio of the acrylic polymer to the thermoplastic resin (acrylic polymer/thermoplastic resin) is preferably 9/1 to 3/7.

"Sealing Resin"

The sealing resin layer 3 of the present invention exhibits the aforementioned specific melt properties.

As the primary factor that determines the melt properties of the sealing resin layer 3, there may be mentioned the ratio of the binder component (A) to the thermosetting component (B) in the composition. Since the binder component (A) has a high molecular weight, fluidity on heating is suppressed as the added amount of the binder component (A) is increased, while fluidity is exerted when the added amount of the binder component (A) is small. On the other hand, the thermosetting component (B) has a low molecular weight and exhibits fluidity before curing. Therefore, in order to exhibit appropriate fluidity and combine further fluidity in such an extent that bleeding is avoided, the amount of the binder component (A) with respect to thermosetting component (B) in the blend is important. The amount of the thermosetting component (B) blended is preferably 10 to 99 parts by mass, more preferably 50 to 97 parts by mass, particularly preferably 83 to 95 parts by mass, with respect to 100 parts by mass of the total amount ((A)+(B)) of the binder component (A) and the thermosetting component (B).

When the sealing resin contains a large amount of a thermoplastic resin, the sealing resin exhibits excessive fluidity and desired elastic modulus and melt viscosity may not be obtained. Therefore, when a thermoplastic component is admixed, the amount thereof is selected within the above range as appropriate in accordance with a desired elastic modulus and a desired melt viscosity.

Figure 2A:
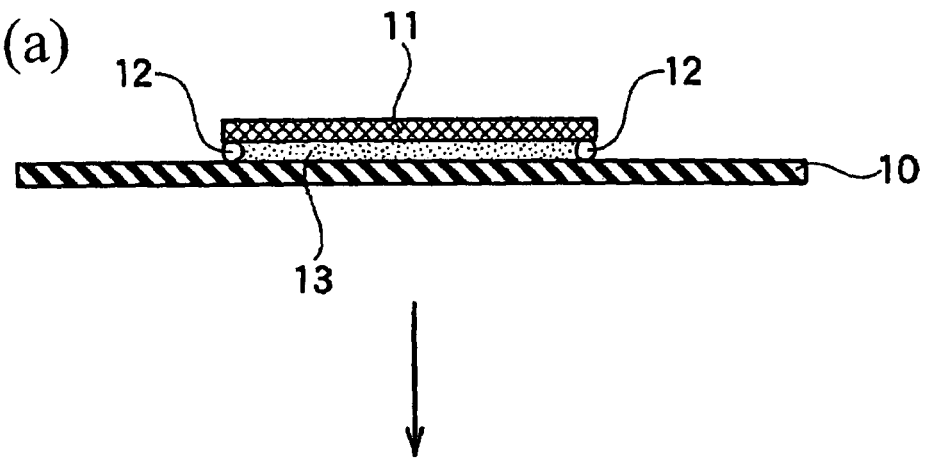
FIGS. 2(a)-2(c) show the steps of a manufacturing method relating to the present invention.
Figure 2B:
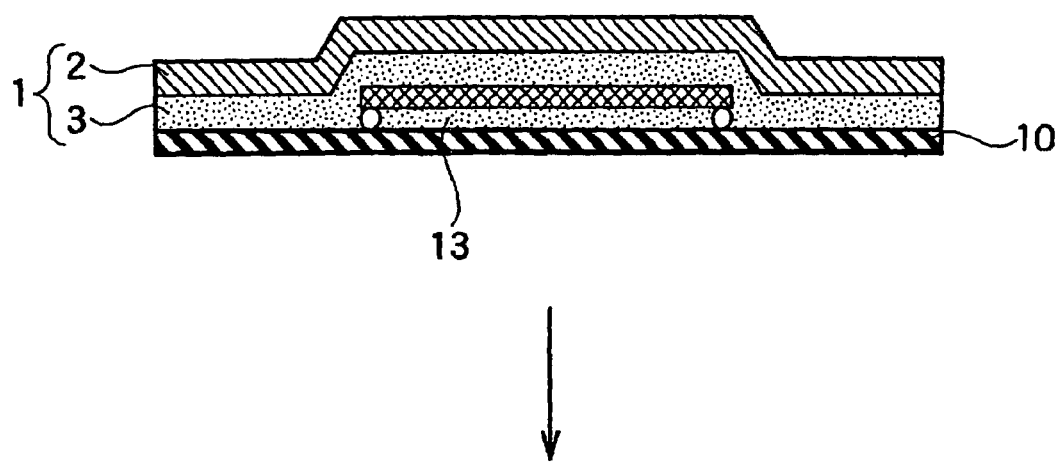
Figure 2C:
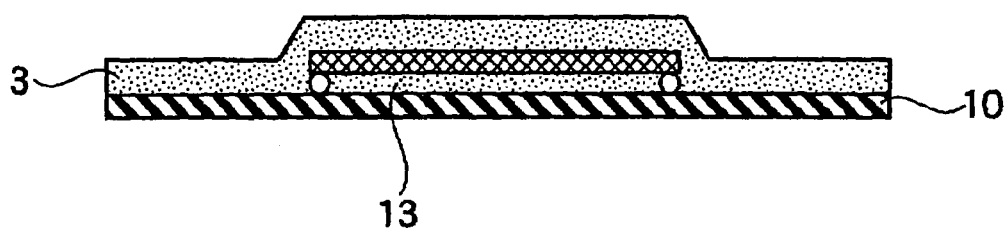

The thickness of the sealing resin layer 3 composed of the above components has different suitable ranges depending on the types of devices to be sealed. In the case of a flip-chip bonded device, the thickness of the sealing resin layer 3 is preferably 10 to 1000 μm, more preferably 30 to 800 μm. When the sealing resin layer 3 is thin, the chip can be sealed in a form wherein the portion above the chip is higher than the periphery thereof as shown in FIG. 2. When the sealing resin layer 3 is thicker than the chip, the chip may be sealed in a similar form to that shown in FIG. 2 or the whole chip may be embedded in the sealing resin layer 3, flattening the top surface of the sealing resin layer 3.

Figure 3A:
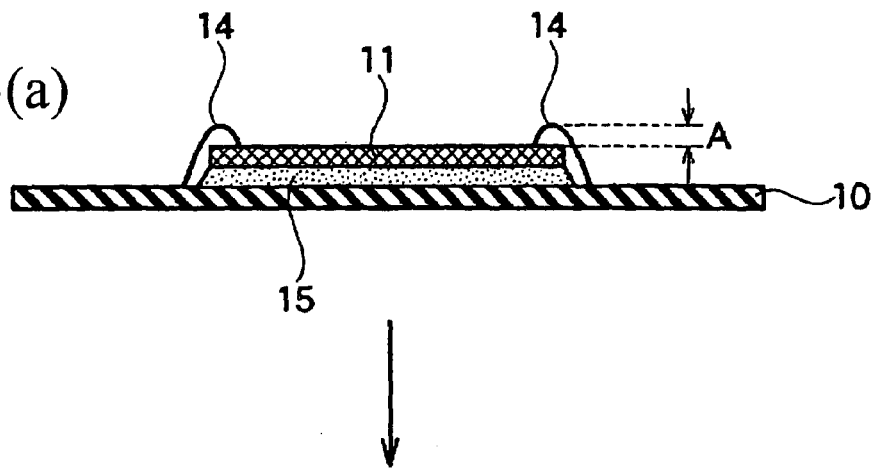
FIGS. 3(a)-3(c) show the steps of a manufacturing method relating to the present invention.
Figure 3B:
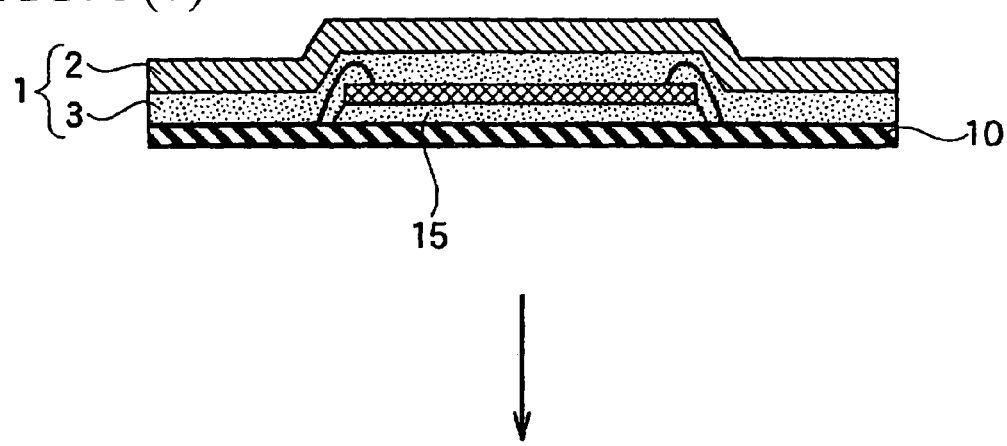
Figure 3C:
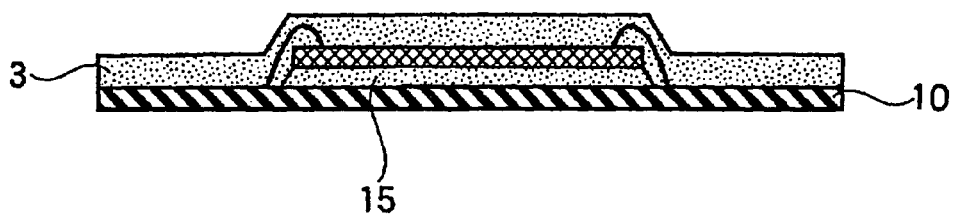

When a device to be sealed is a wire-bonded device, the lower limit of the thickness of the sealing resin layer 3 depends on the wire height (the distance between the top of the wires and the top surface of a semiconductor chip to which the wires are bonded, shown as "A" in FIG. 3), and needs to include an allowance of at least 10% or more of the wire height. Thus, when the height of wires is 50 μm, for example, the thickness of the sealing resin layer 3 is preferably 55 μm or more. In general, the thickness of the sealing resin layer 3 applied to a wire-bonded device is preferably approximately 40 to 2000 μm more preferably approximately 50 to 1000 μm.

The sealing resin composed of the above components has a thermosetting property and can be used for resin sealing of a circuit substrate on which a chip is mounted. In particular, since the sealing resin layer 3 of the present invention has such specific melt properties as described above, the sealing resin is not softened before it comes close to or contacts with the surface of a circuit substrate. Therefore, if the pressure applied to the resin sheet is immediately released when the sealing resin layer 3 comes into contact with the surface of the circuit substrate and gets loosely attached thereto, the sealing resin is neither deformed nor bled out. Further, the resin can seal a flip-chip bonded device without forming voids, and the resin can seal a wire-bonded device without damaging wires. Eventually, through thermosetting, a cured product with a high impact resistance can be obtained.

"Semiconductor Sealing Resin Sheet 1"

A semiconductor sealing resin sheet 1 is composed of a supporting sheet 2 and a sealing resin layer 3 releasably laminated thereon. A protective film may be laminated on the exposed surface of the sealing resin layer to protect the sealing resin layer 3. As the protective film, a film similar to the supporting sheet 2 can be used.

There are no particular limitations on the method for manufacturing the semiconductor sealing resin sheet 1. Coating and drying a composition composing the sealing resin layer 3 on the supporting sheet 2, or by forming a sealing resin layer on another releasable sheet and then transferring it to the supporting sheet 2 may manufacture the sealing resin sheet 1. When a sealing resin layer 3 with a required thickness cannot be formed by a single step of coating and drying, the same composition may be coated and dried on the sealing resin layer a plurality of times, or a sealing resin layer separately formed by coating and drying may be laminated on a resin sheet formed as a thin layer to obtain the sealing resin layer 3 with a required thickness.

"Method for Manufacturing Semiconductor Devices"

The following is explanation of the method for manufacturing semiconductor devices relating to the present invention using the semiconductor sealing resin sheet 1.

In the manufacturing method of the present invention, firstly, a circuit substrate 10 with a semiconductor chip 11 mounted thereon is prepared.

FIG. 2 shows an example for a flip-chip bonded device, and FIG. 3 shows an example for a wire-bonded device.

In a flip-chip bonded device, it is electrically connected to outer leads (not shown) on a circuit substrate 10 through solder balls 12 formed on the undersurface of the semiconductor chip 11. The space between the undersurface of the chip and the circuit substrate 10, formed by the solder balls 12, may usually be filled with an adhesive resin 13 called underfill.

In a wire-bonded device, electrode terminals on a semiconductor chip 11 are electrically connected to outer leads on a circuit substrate 10 through wires 14. The wires 14 are generally made of gold wires or the like. The circuit substrate 10 and the semiconductor chip 11 are bonded together through an adhesive resin 15, which is a conventional thermosetting adhesive such as an epoxy-type adhesive.

Various methods publicly known may be used to obtain the circuit substrate 10 on which the semiconductor chip 11 is mounted with the above-described structure. FIG. 2 and FIG. 3 illustrate a structure in which one semiconductor chip is mounted on the circuit substrate 10, but semiconductor chips may be mounted at regular intervals in the longitudinal direction on a long circuit substrate 10. Further, on a long and wide circuit substrate 10, semiconductor chips may be arrayed two-dimensionally at regular intervals.

Next, the circuit substrate 10 is heated so as to heat the surface of the circuit substrate 10, the surface of semiconductor chip 11, and the wires 14 to a temperature higher than the melting temperature of the sealing resin layer 3. After that, the surface of the sealing resin layer 3 in the semiconductor sealing resin sheet 1 of the present invention is brought into contact with the surface of the heated chip 11 and the wires 14. Since the sealing resin layer 3 has such specific melt properties as described above, when the sealing resin layer 3 comes into contact with the surface of the chip 11 or the wires 14, the sealing resin layer is quickly melted and softened at the contacted part. Concavo-convex parts and gaps on the semiconductor-chip-mounted surface are filled with the melted resin, and the wires 14 are embedded in the sealing resin layer 3. In order to sufficiently fill especially fine concavo-convex parts and gaps on the semiconductor-chip-mounted surface with the sealing resin, it is preferred that the sealing resin layer be pressed to attach to the semiconductor-chip-mounted surface under reduced pressure or vacuum. On the other hand, the sealing resin is melted and softened more slowly in positions distant from the surface of the chip 11 and the wires 14, since less heat is conducted. Therefore, the wires 14 are embedded in the sealing resin layer 3 without being damaged, while deformation of the sealing resin is suppressed to be small in positions distant from the wires. Then, the sealing resin layer 3 is closely attached to the surfaces of the circuit substrate 10 and of the semiconductor chip 11, and a predetermined pressure is applied to the sealing resin layer 3. At this time, most of the sealing resin layer is not fully heated yet and keeps a high viscosity, so that bleeding out does not occur, that is, the sealing resin does not run out of the edges of the device. When the predetermined pressure is applied and then released, the sealing resin layer is molded into a desired shape in an uncured state or a half-cured state.

There are no particular limitations on a means for pressing the semiconductor sealing resin sheet 1 onto the chip 11, but it is preferred that the pressure be applied perpendicularly to the chip 11 and the circuit substrate 10 to avoid excessive load on the chip 11, the wires 14 or the like. Specifically, it is preferred that a pressing plate having a flat contacting surface be placed in parallel with the circuit substrate 10, the chip 11 and the semiconductor sealing resin sheet 1 and be pressed in a perpendicular direction.

Further, it is preferred that pressing be carried out in two steps, in order to seal without involving air around the legs of the chip 11. On the second pressing, a pressing plate having a hole slightly larger than the chip 11 is prepared, positioned to align the chip 11 and the hole, and perpendicularly pressed so as to press the circuit substrate 10 at around the legs of the chip 11 except the body of the chip 11. In the case of a wire-bonded device, is used a pressing plate having a hole slightly larger than the size of the external terminals to which the bonding wires are connected.

After that, the supporting sheet 2 on the sealing resin layer 3 is peeled off, and the whole circuit substrate thus sealed is heated for thermosetting in a heating oven and the like; thus the step of resin sealing completes. When a plurality of chips is mounted on the circuit substrate, the circuit substrate may be cut into a predetermined size by dicing or another method to separate the chips subsequently.

When a resin having a melt viscosity at 120° C. below 100 Pa·s is used in place of the sealing resin layer 3 of the present invention, the resin is likely to bleed out because the viscosity of the whole resin becomes low at the time when the resin sheet is pressed to attach to the circuit substrate 10. In addition, the sealing resin layer is readily deformed before pressing, so there may be a fear that air is involved into the interlayer area between the sealing resin layer and the circuit substrate 10. In the case of using a resin with such a property that it takes 60 sec or longer before the melt viscosity reaches a minimum value, since the viscosity is difficult to decrease locally, the whole sealing resin layer is required to be fully preheated to attain required fluidity. However, when the whole resin layer is preheated excessively, the sealing resin layer is deformed, the resin is easily bled out, and air is likely to be involved into the interlayer area between the sealing resin layer and the circuit substrate 10. Without preheating, due to insufficient fluidity of the sealing resin layer, in the case of a flip-chip bonded device, filling with the resin may be insufficient and voids are formed around the legs of the chip, or in the case of a wire-bonded device, there may be a fear that the wires 14 is crushed or broken.

EXAMPLES

The present invention will be explained with reference to Examples below, but it should be construed that the present invention is in no way limited to these Examples.

In Examples and Comparative Examples, "Elastic modulus", "Melt viscosity", and "Time required for the melt viscosity to reach its minimum value" are evaluated as follows:
"Elastic Modulus" and "Melt Viscosity"

Each of the sealing resin layers of Examples and Comparative Examples was layered into a test sample having a diameter of 8 mm and a thickness of 3 mm. Elastic modulus and melt viscosity at 100° C. were measured with a dynamic viscoelasticity measuring apparatus (RDA II, manufactured by Rheometric Scientific Inc.) at a frequency of 1 Hz.
"Time Required for the Melt Viscosity to Reach its Minimum Value"

Using the same test samples, analyzer and frequency as above, the temperature of the sealing resin was elevated at a rate of 1.0° C./sec from normal temperature and kept constant at 120° C., and a profile of viscosity vs. time was obtained to evaluate the time required for the melt viscosity to reach its minimum value.
"Sealing Resin Layer"

The materials blended for preparation of sealing resins are shown below. These materials were used in common for Examples and Comparative Examples.
(A) Binder component: a copolymer having a weight average molecular weight of approximately 800,000 and a glass transition temperature of −28° C., which was prepared by copolymerizing 55 parts by mass of butyl acrylate, 10 parts by mass of methacrylic acid, 20 parts by mass of glycidyl methacrylate, and 15 parts by mass of 2-hydroxyethyl acrylate
(B) Thermosetting component: A mixture of the following ingredients was used;

Bisphenol A-type liquid epoxy resin containing acrylic rubber fine particles dispersed (BPA328, manufactured by Nippon Shokubai Co., Ltd., having an epoxy equivalent weight of 230): 30 parts by mass;

Bisphenol A-type solid epoxy resin (1055, manufactured by Nippon Shokubai Co., Ltd, having an epoxy equivalent weight of 875 to 975): 40 parts by mass;

o-Cresol-novolak-type epoxy resin (EOCN, manufactured by Nippon Kayaku Co., Ltd., having an epoxy equivalent weight of 213 to 223): 10 parts by mass; Dicyanediamide curing agent (Adeka Hardener 3636AS, manufactured by Asahi Denka Co., Ltd.): 1 part by mass; and Imidazole curing promoter (Curezol 2PHZ, manufactured by Shikoku Chemicals Corporation): 1 part by mass.
(C) Other Components:

C1: Silane coupling agent (MKC silicate MSEP2, manufactured by Mitsubishi Chemical Corporation), C2: Polyisocyanate cross-linking agent (an adduct of trimethylol propane and toluoylene diisocyanate).

Example 1

(1) Production of a Semiconductor Sealing Resin Sheet

A sealing resin composition having the composition shown in Table 1 was coated on a surface of a supporting sheet (SP-PET3811, manufactured by Lintec Corporation, having a thickness of 38 μm), wherein the surface was subjected to release treatment using a silicone resin, with a roll knife coater to obtain a thickness after drying of 100 μm (coating and drying were performed twice to increase the thickness) and dried. Subsequently the exposed surface of the sealing resin layer thus coated and dried was laminated on the surface that was subjected to release treatment of another releasable film (SP-PET3801, manufactured by Lintec Corporation, having a thickness of 38 μm), which served as a protective film, to obtain a semiconductor sealing resin sheet.
(2) Production of a Resin-Sealed Semiconductor Device (Flip-Chip Type)

A chip was prepared, which was made of a silicon wafer and had a size of 5×5 mm, a thickness of 100 μm, and a dummy circuit on the mirror side. Bumps were formed on the dummy circuit. The chip was flip-chip bonded with an anisotropic conductive adhesive on a dummy circuit substrate 10 (made of glass-epoxy and electrolytic copper foil).

The flip-chip bonded dummy circuit substrate 10 was placed on a heating table heated at 120° C. The protective film was peeled off from the sealing resin sheet produced in (1), and the exposed sealing resin layer was placed on the top surface of the dummy circuit substrate 10 to contact the sealing resin layer to the top surface of the chip. A pressing plate slightly larger than the chip was placed, so as to align with the chip, on the supporting sheet side of the sealing resin sheet, and the pressing plate was pressed toward the chip. Subsequently the pressing plate was replaced by another pressing plate that had a hole slightly larger than the chip and was sized to the dummy circuit substrate 10, and the dummy circuit substrate 10 was pressed and adhered. The supporting sheet was removed from the sealing resin layer, and the sealing resin layer was cured with heating at 160° C. for 60 min to obtain a flip-chip bonded resin-sealed semiconductor device.

The resin-sealed semiconductor device was subjected to continuity test. There were no differences in the continuity before and after resin sealing. The inside of the sealed body was inspected with a scanning ultrasonic flaw detector and by cross-section observation. No void was found around the legs of the chip and no excess sealing resin was bled out of the edges of the semiconductor device.

Example 2

By using the same sealing resin sheet as that in Example 1, a wire-bonded resin-sealed semiconductor device was produced.
(3) Production of a Resin-Sealed Semiconductor Device (Wire-Bonded Type)

A chip was prepared, which was made of a silicon wafer and had a size of 5×5 mm, a thickness of 100 μm and a dummy circuit on the mirror side. The chip was chip-bonded with an adhesive on a dummy circuit substrate 10 (made of glass-epoxy and electrolytic copper foil). Further the terminals on the dummy circuit were connected to the terminals on the dummy circuit substrate 10 by wire-bonding. The height of the bonding wire was approximately 40 μm high from the top surface of the chip.

The chip-bonded dummy circuit substrate 10 was placed on a heating table heated at 120° C. The protective film was peeled off from the sealing resin sheet produced in (1), and the exposed sealing resin layer was placed on the top surface of dummy circuit substrate 10, so that the sealing resin layer was placed close to the tops of wires. A pressing plate that is slightly larger than the size where the external terminals for the wires were disposed was placed, so as to align with the chip, on the supporting sheet side of the sealing resin sheet, and the pressing plate was pressed toward the chip. Subsequently the pressing plate was replaced by another pressing plate that has a hole slightly larger than the size where the external terminals were connected to the bonding wires and was sized to the dummy circuit substrate 10, and the dummy circuit substrate 10 was pressed and adhered. The supporting sheet was removed from the sealing resin layer, and the sealing resin layer was cured with heating at 160° C. for 60 min to obtain a wire-bonded resin-sealed semiconductor device.

The resin-sealed semiconductor device was subjected to continuity test. There were no differences in the continuity before and after resin sealing. The inside of the sealed body was inspected with a scanning ultrasonic flaw detector and by cross-section observation. No void was found around the legs of the chip and no excess sealing resin was bled out of the edges of the semiconductor device.

Comparative Examples 1 and 2

The same procedure as in Examples 1 and 2 was repeated except that a sealing resin having the composition for Comparative Example 1 in Table 1 was used. There were no problems in the continuity, but a large amount of air was incorporated in the interlayer area between the dummy circuit substrate 10 and the sealing resin.

Comparative Example 3

The same procedure as in Example 1 was repeated except that a sealing resin having the composition for Comparative Example 3 in Table 1 was used. There were no problems in the continuity, but air remained involved around the legs of the chip.

Comparative Example 4

The same procedure as in Example 2 was repeated except that a sealing resin having the composition for Comparative Example 3 in Table 1 was used. There was no continuity after resin sealing. Further, air remained involved around the legs of the chip.

TABLE 1

|  | Examples 1, 2 | Comparative Examples 1, 2 | Comparative Examples 3, 4 |
|---|---|---|---|
| (A) Binder component | 10.9 | 0 | 26.8 |
| (B) Thermosetting adhesive component | 89.1 | 100 | 73.2 |
| (C1) Silane coupling agent | 0.6 | 0.6 | 0.6 |
| (C2) Polyisocyanate | 0.2 | 0.2 | 0.2 |
| Elastic modulus (Pa) | $1.8 \times 10^3$ | $5.0 \times 10^2$ | $2.6 \times 10^3$ |
| Melt viscosity (Pa·s) | 140 | 80 | 220 |
| Time required for the melt viscosity to reach its minimum value (sec) | 23 | 13 | 80 |

The present invention provides a semiconductor sealing resin sheet with which no void was formed in sealing a flip-chip bonded device and wires are not deformed or broken in sealing a wire-bonded device, and a method for manufacturing semiconductor devices using the resin sheet. The present invention can contribute to improving quality and productivity of semiconductor devices.

What is claimed is:

1. A method for manufacturing semiconductor devices comprising a step in which a circuit substrate with a semiconductor chip mounted thereon is prepared; the circuit substrate is heated; and then the surface of a sealing resin layer in an unheated semiconductor sealing resin sheet is embedded in concavo-convex parts and gaps on the semiconductor-chip-mounted surface of the circuit substrate and the surface of the sealing resin layer is brought into contact with the surface of the circuit substrate and then the sealing resin layer is thermally cured to seal the semiconductor chip, wherein the semiconductor sealing resin sheet is composed of a supporting sheet and the sealing resin layer releasably laminated on the supporting sheet, wherein the sealing resin layer has a thermosetting property, the sealing resin layer before thermosetting has an elastic modulus of $1.0 \times 10^3$ to $1.0 \times 10^4$ Pa and a melt viscosity at 120° C. of 100 to 200 Pa·s, and the time required for the melt viscosity to reach its minimum value is 60 sec or less when the sealing resin layer before thermosetting is kept at a constant temperature of 120° C.

2. The method for manufacturing semiconductor devices according to claim 1, wherein the semiconductor chip is mounted on the circuit substrate in a wire-bonded form.

3. The method for manufacturing semiconductor devices according to claim 1, wherein the semiconductor chip is mounted on the circuit substrate in a flip-chip bonded form.

* * * * *